United States Patent [19]

Kliem et al.

[11] Patent Number: 4,605,849
[45] Date of Patent: Aug. 12, 1986

[54] PHOTOSENSITIVE DEVICES HAVING ENHANCED BLUE LIGHT RESPONSE

[75] Inventors: Peter O. Kliem, Weston; Alan B. Fischer, Cambridge; Shai Inbar, Brookline, all of Mass.

[73] Assignee: Polaroid Corporation, Cambridge, Mass.

[21] Appl. No.: 666,890

[22] Filed: Oct. 31, 1984

[51] Int. Cl.$^4$ ............................................. H01J 3/14
[52] U.S. Cl. .................................. 250/216; 250/458.1
[58] Field of Search ............... 250/483.1, 458.1, 461.1, 250/216; 350/354

[56] References Cited

U.S. PATENT DOCUMENTS

| | | | |
|---|---|---|---|
| 3,622,316 | 11/1971 | Bird et al. | 96/1.7 |
| 3,622,317 | 11/1971 | Bird et al. | 96/1.7 |
| 3,730,714 | 5/1973 | Bird et al. | 96/1.7 |
| 3,799,783 | 3/1974 | Hill et al. | 96/124 |
| 3,887,271 | 6/1975 | Yamaguchi | 350/354 |
| 3,912,931 | 10/1975 | Gravisse et al. | 250/458 |
| 4,051,374 | 9/1977 | Drexhage | 250/370.6 |
| 4,088,508 | 5/1978 | Gravisse | 136/89 |
| 4,367,930 | 3/1981 | Kolb | 352/27 |

OTHER PUBLICATIONS

Ultraviolet Downconverting Phosphor For Use With Silicon CCD Imagers, Blouke et al, Applied Optics, vol. 19, No. 19/ Oct. 1, 1980.

Primary Examiner—David C. Nelms
Assistant Examiner—James Gatto
Attorney, Agent, or Firm—Gaetano D. Maccarone

[57] ABSTRACT

The blue light response of solid state photosensitive devices such as silicon based charge-coupled devices (CCDs), charged-injection devices, photovoltaic devices and the like is enhanced by applying to the surface thereof a thin layer which includes a first, or donor, dye which absorbs efficiently in the blue region of the spectrum and a second, or acceptor, dye which absorbs efficiently in the green region of the spectrum, there being substantial overlap between the emission spectrum of the donor and the absorption spectrum of the acceptor. The relative concentrations of the dyes are controlled such that the donor dye transfers energy nonradiatively to the acceptor dye which is caused to fluoresce thereby emitting light in the region where the device has substantial photoresponse.

6 Claims, 1 Drawing Figure

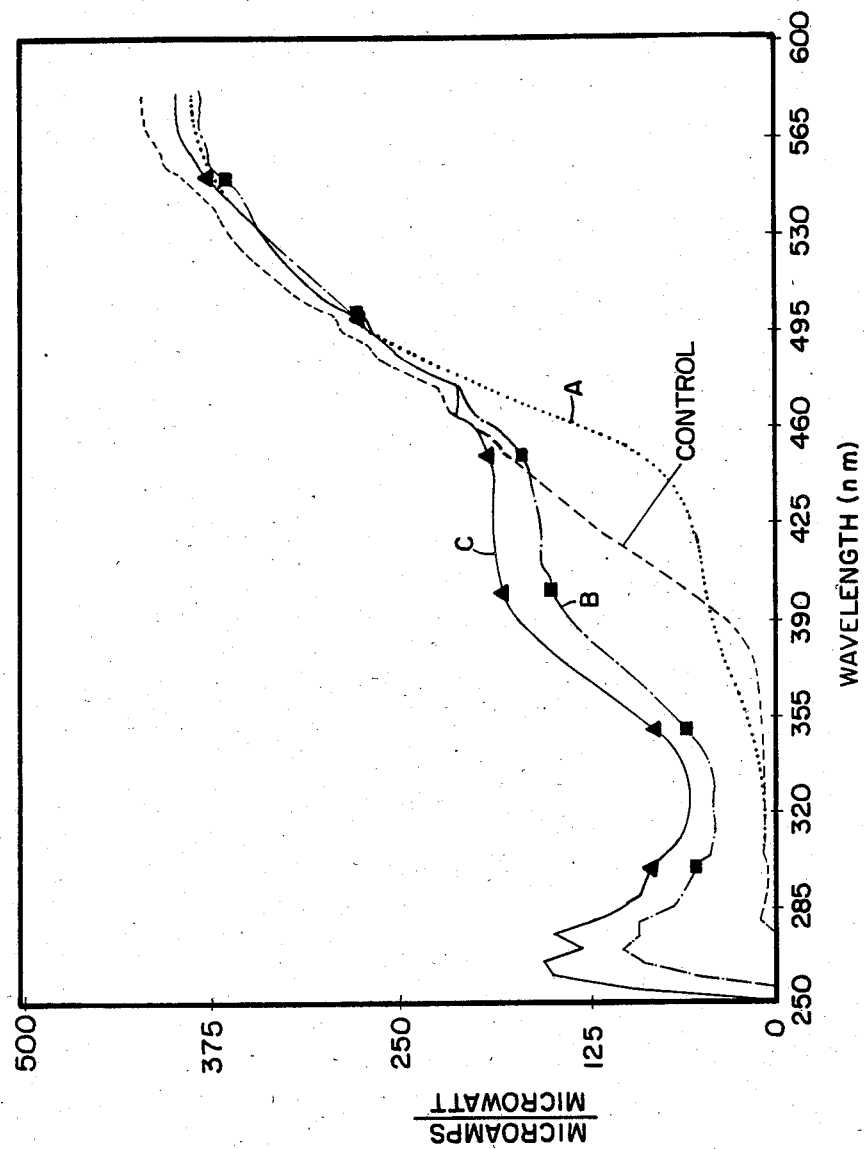

PHOTOSENSITIVE DEVICES HAVING ENHANCED BLUE LIGHT RESPONSE

BACKGROUND OF THE INVENTION

This invention relates generally to solid state photosensitive devices which have enhanced blue light response.

Color photosensitive devices which utilize charge-handling solid state image sensors of various types, for example, charge-coupled devices, commonly referred to as CCDs, and charge coupling imagers, commonly referred to as CCIs, have been used in various electronic imaging devices such as video cameras. Typically a CCD is a silicon based solid state device and like other silicon devices its photosensitivity peaks in the red region and may fall off sharply in the blue region of the visible spectrum. For many such devices there is no ultraviolet sensitivity at all.

Various techniques have been disclosed to extend the photoresponse of silicon based photoresponsive devices. For example, U.S. Pat. No. 3,912,931 discloses a photovoltaic device comprising a conventional photovoltaic cell and a series of thin layers successively applied on the photocell surface, the layers being of different compositions and selected in such a manner that the light energy in a particular zone of the spectrum falling on the outermost layer may be transferred successively in cascade, through the intermediary of the various layers, up to the spectral sensitivity of the photovoltaic cell. The series of layers of luminescent materials is used in cascade in such a manner that photons emitted by a layer of one material are used to excite a material having a higher wavelength in the next layer and so forth. Thus, this technique exploits the fluorescent properties of the different materials to convert shorter wavelength incident light to longer wavelength light to which the device is responsive.

U.S. Pat. No. 4,088,508 discloses a radiant energy amplifying device receiving energies from short wavelengths by a plurality of scintillating materials having high quantum yields operating in cascade which are distributed homogeneously in a matrix of a synthetic resinous material whose absorption threshold is at a wavelength less than the absorption zone of the scintillating material located at the beginning of the cascade. Here, the scintillating materials, although operating in the cascade mode, are located in one discrete layer.

BRIEF SUMMARY OF THE INVENTION

The present invention relates to solid state photosensitive devices such as, for example, charge-coupled devices, charge coupling imagers, charge injection devices and photovoltaic devices having enhanced blue light response. The photosensitive devices of the invention include a thin layer comprising a first or donor, dye which absorbs efficiently in the blue region of the spectrum and a second, or acceptor, dye which absorbs efficiently in the green region of the spectrum dispersed in a polymeric binder material. The donor and acceptor dyes are selected such that there is substantial overlap between the fluorescence emission spectrum of the donor, e.g., light emitted from its singlet, excited state, and the absorption spectrum of the acceptor dye. The relative concentrations of the dyes in the binder are controlled such that the donor dye, upon absorbing incident light within its absorption spectrum efficiently transfers energy nonradiatively to the acceptor dye which in turn fluoresces and emits light in the region where the device has substantial photoresponse.

The concentration of the donor dye should be relatively high, since its primary function is to absorb incident blue light whereas the concentration of the acceptor dye is relatively low since its primary functions are to receive energy transferred nonradiatively by the donor dye and to emit light of longer wavelengths through fluorescence. The absorbance (A) of the donor dye is given by the expression $A = \epsilon l c$ where $\epsilon$ is the absorption coefficient of the donor dye, $l$ is the layer thickness in cm and $c$ is the donor dye concentration in mole/liter. For efficient operation it is desirable to have A equal to about 2, equivalent to about 99% absorption of the incident blue light. Generally, to obtain such a level of absorption for the donor dye in the relatively thin dye later, the donor dye typically is present in a concentration of from about 0.25 molar to about 1 molar. Of course, as is apparent, the actual concentration in any particular instance is independent upon the layer thickness and the absorption coefficient of the donor dye. For example, where the donor dye is Acridine Orange which has $\epsilon_{max} \cong 40,000$ and the dye layer is 1 micron ($1 \times 10^{-4}$ cm) thick, a concentration of about 0.5 molar would give absorbance of about 2. The concentration of the acceptor dye is dependent upon the concentration of the donor dye as will be discussed in more detail below. As noted above, the acceptor dye is present in a relatively low concentration, for example, about $10^{-3}$ to about $10^{-2}$ molar.

The dye layer should be relatively thin, for example, about 2 microns or less, in part because of the typical physical dimensions of the solid state devices and in part because of light loss considerations. For example, CCDs typically are from about 10 to 15 microns thick and only a relatively thin dye layer can be applied to the CCD surface due to mechanical stability considerations. In addition, the layer should be thin so as to minimize the amount of incident light lost by scattering through the sides of the layer.

The photosensitive devices of the invention are capable of providing a large Stokes shift for the incident blue light and the energy transfer is very efficient with the relatively low concentration of the acceptor dye. The nonradiative energy transfer technique which is exploited by these photosensitive devices allows the separation of the absorption and emission functions between the donor and acceptor dyes, respectively, thereby providing great flexibility in the choice of dyes which may be used. Additionally, by separating these functions the acceptor dye is present in relatively low concentrations thus substantially minimizing light losses due to self-quenching during fluorescence which can occur at high concentrations of fluorescing dyes.

BRIEF DESCRIPTION OF THE DRAWING

For a better understanding of the invention as well as other objects and further features thereof, reference is made to the following detailed description of various preferred embodiments thereof taken in conjunction with the accompanying drawing wherein the Figure is a graphical illustration of the photocurrent output curves, as a function of wavelength, for two photovoltaic cells according to the invention and two cells used for comparative purposes.

DESCRIPTION OF THE PREFERRED EMBODIMENTS

The binder material may be any suitable polymeric material which is optically transparent to blue and green light. Typical suitable binder materials include, for example, polymethylmethacrylate, polytrifluoromethylmethacrylate, polystyrene, polyacrylamide, polyvinyl alcohol, trifluoropolyvinyl alcohol, poly-4-vinyl-pyridine, polyvinylpyrrolidone and mixtures thereof. Preferred binder materials are polymethylmethacrylate and trifluoropoly-vinyl alcohol. The donor and acceptor dyes which are used should be soluble in the binder material in the concentrations required to provide the desired results.

The donor dye can be any suitable dye which absorbs efficiently in the blue region of the spectrum, i.e., from about 390 to about 500 nm. The donor dye preferably has a $\lambda_{max}$ of about 450 nm. As indicated previously, the primary function of the donor dye is to absorb incident blue light and therefore the dye preferably should be a strongly absorbing material, for example, having an $\epsilon_{max}$ greater than 10,000 mol$^{-1}$ 1 cm$^{-1}$. Typical suitable donor dyes are Arcidine Yellow, Arcidine Orange, Coumarin 540, Coumarin 503, Coumarin 515, Coumarin 521 and DCM (4-(dicyanomethylene)-2-methyl-6-(p-dimethylaminostyryl)-4H-pyran).

The acceptor dye can be any suitable dye which absorbs efficiently in the green region of the spectrum, i.e., from about 500 nm to about 600 nm and preferably one which has a $\lambda_{max}$ at about 550 nm. The acceptor dye preferably is a strongly absorbing material having a high extinction coefficient, for example, $\epsilon_{max}$ of from about 10,000 to about 100,000 mol$^{-1}$ cm$^{-1}$. The dye typically should have a high quantum fluorescence yield (where the quantum fluorescence yield=photons out/photon in), for example, at least about 0.8, preferably 0.9 or more and optimally as close to 1.0 as possible. Typical suitable acceptor dyes include the rhodamines, for example, Rhodamine 101, Rhodamine 560, Rhodamine 575, Rhodamine 590 (or 6G), and Sulpho Rhodamine B (for Ketone Red 620).

The particular donor and acceptor dye pair selected should be matched to the absorption spectrum of the photoresponsive semiconductive material of the device. Preferred dye pairs for use in the case of silicon based CCDs are made up of Coumarin and Rhodamine 6G, Coumarin 540 and Rhodamine 101, DCM and Rhodamine 6G, and Acridine Yellow and Rhodamine 6G.

As stated previously the donor dye is present in relatively high concentrations, for example, about 0.25 to about 1.0 molar, based on the binder material, and the acceptor dye is present in relatively low concentration, for example, from about $10^{-3}$ to about $10^{-2}$ molar. The relative amounts of the donor and acceptor dyes should be controlled such that the donor dye transfers at least a substantial part of the energy from it singlet excited state, i.e., at least 80% and optimally as close to 100% as possible, nonradiatively to the acceptor dye without undergoing any substantial amount of fluorescence. If the efficiency of the nonradiative energy transfer is less than 100% then some of the donor fluorescence will occur.

The optimum amounts of each dye for any particular device application can be determined by routine scoping experiments. Initially the donor dye concentration can be determined with respect to the criterion that substantially all of the blue light which will be incident on the device should be absorbed by the dye. Subsequently the optimum amount of acceptor dye is determined by varying the acceptor dye concentration until the fluorescence of the donor dye is substantially completely quenched. This condition can conveniently be determined experimentally by passing the light reflected from the dye layer through a monochromator and collecting the light with a photomultiplier tube. Thus, the acceptor dye concentration can be controlled such that it will absorb substantially all of the energy transferred to it nonradiatively by the donor dye and at the same time prevent any substantial fluorescence by the donor dye.

The dye layer thickness is typically about 2 microns or less and preferably about 1 micron in view of the reasons discussed above. Such relatively thin dye layers can provide the desired donor dye absorption given the typical extinction coefficient and concentration of the donor dye.

The devices of the invention can be fabricated by known techniques. Generally, the binder material and the dyes are dissolved in a suitable solvent, for example, an organic solvent to form a coating solution which is then applied to the surface of the device such as by dip coating, spraying, etc. Upon removal of the solvent the dye layer remains adhered to the surface of the photoresponsive substrate.

The invention will now be described further in detail with respect to specific preferred embodiments by way of example, it being understood that these are intended to be illustrative only and the invention is not intended to be limited to the materials, conditions, process parameters, etc., which are recited therein.

EXAMPLE 1

A solution of trifluoropolyvinyl alcohol (TFPVA) was prepared by dissolving 4 g of TFPVA in 96 g of absolute ethanol. Several 5 ml aliquots of this solution were placed in vials and Coumarin 540A was added to the vials to give solutions which were $9.4 \times 10^{-3}$ molar in the dye as determined by absorption spectroscopy. Rhodamine 101 was added to the vials in differing amounts to give solutions having concentrations of Rhodamine 101 as follows:

| SOLUTION | CONC (MOLAR) |
|---|---|
| A | $2.1 \times 10^{-6}$ |
| B | $4.3 \times 10^{-6}$ |
| C | $8.6 \times 10^{-6}$ |
| D | $1.7 \times 10^{-5}$ |
| E | $3.45 \times 10^{-5}$ |
| F | $6.9 \times 10^{-5}$ |
| G | $1.38 \times 10^{-4}$ |
| H | $2.76 \times 10^{-4}$ |

Test films of these solutions were coated on glass slides using a spin coater and the absorption and fluorescence spectra of the films were measured. The fluorescence spectra were recorded in a front surface detection mode on a Spex Fluorolog fluorometer. The absorption spectra were recorded on a GCA-McPherson spectrophotometer with a polymer coated blank in the reference beam. For all the films examined the absorbance maximum of the Coumarin 540A was a constant value of 0.17 absorbance units and the fluorescence spectra were recorded with excitation at 420 nm with a 2.0 nm bandpass.

The integrated fluorescence intensity for each fluorescence spectrum was measured. The maximum integrated fluoroescence intensity was obtained with the $6.9 \times 10^{-5}$ molar concentration of Rhodamine 101.

EXAMPLE II

An approximately 5%, by weight, solution of polymethylmethacrylate in ethyl acetate was prepared. An aliquot of this solution was used to prepare a solution (A) which gave a film which was approximately 1.9 molar in Coumarin 540A, the donor dye, upon drying. Aliquots of this latter solution were used to prepare two additional solutions (Band C) which gave films which were, upon drying, approximately $3.7 \times 10^{-2}$ and $7.4 \times 10 \times^{-2}$ molar in DCM, the acceptor dye, respectively.

Four 1 cm.×1 cm. silicon photovoltaic chips were washed successively with ethanol, tetrahydrofuran and ethanol again to provide clean surfaces. One silicon chip was not coated (CONTROL); the other chips were coated, respectively, with a thin film of the donor dye solution (A) and the two donor dye-acceptor dye solutions (Band C) using a spin coater rotating at 2500 rpm. The coating conditions were such that the films applied to the silicon chips had a Coumarin 540A absorbance of 1.0 at 420 nm and the two chips coated with the compositions according to the invention had DCM absorbance of 0.05(B) and 0.10(C) respectively.

The photocurrent output of the control and the coated silicon photovolatic cells, expressed as microamps of photocurrent/microwatt of irradiant power, as a function of wavelength was measured. The photocurrent output curves are shown in the Figure. It can be seen that the photovoltaic cells according to the invention exhibited enhanced blue light response.

Although the invention has been described with respect to various embodiments thereof it is not intended to be limited thereto but rather those skilled in the art will recognize that variations and modifications may be made therein which are within the spirit of the invention and the scope of the appended claims.

What is claimed is:

1. A photosensitive element having enhanced blue light photoresponse comprising a solid state photosensitive device carrying on a surface thereof a thin layer comprising a donor dye and an acceptor dye uniformly dispersed in an optically transparent polymeric binder material, wherein said donor dye absorbs light in the blue region of the spectrum and said acceptor dye absorbs light in the green region of the spectrum, there is substantial overlap between the fluorescence emission spectrum of the donor dye and the absorption spectrum of the acceptor dye, said donor and acceptor dyes being present in relative amounts such that said donor dye is adapted to transfer at least a substantial portion of the energy from its singlet excited state nonradiatively to said acceptor dye.

2. The photosensitive element as defined in claim 1 wherein said photosensitive device comprises a silicon based charge-coupled device.

3. The photosensitive element as defined in claim 2 wherein said donor dye has λ max of about 450 nm and said acceptor dye has λ max of from about 500 nm to about 600 nm.

4. The photosensitive element as defined in claim 3 wherein said acceptor dye has a quantum fluorescence yield of at least about 0.9.

5. The photosensitive element as defined in claim 2 wherein said dye layer has a thickness of about 1 micron or less.

6. The photosensitive element as defined in polymethylmethacrylate or trifluoropolyvinylalcohol.

* * * * *